(12) United States Patent
Li et al.

(10) Patent No.: US 11,984,864 B2
(45) Date of Patent: May 14, 2024

(54) METHOD FOR MANUFACTURING RESONATOR

(71) Applicant: THE 13TH RESEARCH INSTITUTE OF CHINA ELECTRONICS TECHNOLOGY GROUP CORPORATION, Hebei (CN)

(72) Inventors: Liang Li, Shijiazhuang (CN); Xin Lv, Shijiazhuang (CN); Dongsheng Liang, Shijiazhuang (CN)

(73) Assignee: THE 13TH RESEARCH INSTITUTE OF CHINA ELECTRONICS TECHNOLOGY GROUP CORPORATION, Hebei (CN)

( * ) Notice: Subject to any disclaimer, the term of this patent is extended or adjusted under 35 U.S.C. 154(b) by 944 days.

(21) Appl. No.: 16/970,019

(22) PCT Filed: Dec. 27, 2018

(86) PCT No.: PCT/CN2018/124355
§ 371 (c)(1),
(2) Date: Aug. 14, 2020

(87) PCT Pub. No.: WO2020/124662
PCT Pub. Date: Jun. 25, 2020

(65) Prior Publication Data
US 2020/0412319 A1 Dec. 31, 2020

(30) Foreign Application Priority Data
Dec. 20, 2018 (CN) .......................... 201811577385.2

(51) Int. Cl.
*H03H 3/04* (2006.01)
*H03H 3/02* (2006.01)

(52) U.S. Cl.
CPC ......... *H03H 3/04* (2013.01); *H03H 2003/028* (2013.01); *H03H 2003/0435* (2013.01)

(58) Field of Classification Search
CPC ....... H03H 2003/021; H03H 2003/028; H03H 2003/0435; H03H 3/02; H03H 3/04
See application file for complete search history.

(56) References Cited

U.S. PATENT DOCUMENTS 8,692,631 B2    4/2014  Zhang
9,998,087 B2 *  6/2018  Tsai ....................... H10N 39/00
(Continued)

FOREIGN PATENT DOCUMENTS

CN    1665043 A      9/2005
CN    101436565 A    5/2009
(Continued)

OTHER PUBLICATIONS

English translation of the First Office Action of the Chinese application No. 201811577385.2, issued on Jun. 30, 2021, 9 pgs.
(Continued)

*Primary Examiner* — Minh N Trinh
(74) *Attorney, Agent, or Firm* — Cooper Legal Group, LLC

(57) ABSTRACT

The disclosure relates to the technical field of semiconductors, and discloses a method for manufacturing a resonator. The method includes: a substrate is pretreated to change a preset reaction rate of a preset region part of the substrate, so that the preset reaction rate of the preset region part is higher than that of a region outside the preset region part; a preset reaction is performed to the substrate to form a sacrificial material part including an upper half part above an upper surface of the substrate and a lower half part below a lower surface of the substrate; a multilayer structure is formed on the sacrificial material part, and includes a lower
(Continued)

electrode layer, a piezoelectric layer and an upper electrode layer from bottom to top; and the sacrificial material part is removed.

12 Claims, 6 Drawing Sheets

(56) References Cited

U.S. PATENT DOCUMENTS

| | | | |
|---|---|---|---|
| 2003/0160542 A1 | 8/2003 | Bi | |
| 2004/0028103 A1* | 2/2004 | Ueki | H01S 5/18394 |
| | | | 372/96 |
| 2005/0218754 A1 | 10/2005 | Yokoyama | |
| 2008/0072408 A1 | 3/2008 | Sano | |
| 2011/0084779 A1 | 4/2011 | Zhang | |
| 2018/0309428 A1 | 10/2018 | Lim et al. | |
| 2020/0412319 A1* | 12/2020 | Li | H03H 3/04 |
| 2021/0105001 A1* | 4/2021 | Li | H03H 3/02 |

FOREIGN PATENT DOCUMENTS

| | | |
|---|---|---|
| CN | 101465628 A | 6/2009 |
| CN | 203416228 U | 1/2014 |
| CN | 104079250 A | 10/2014 |
| CN | 104242864 A | 12/2014 |
| CN | 105680813 A | 6/2016 |
| CN | 106130498 A | 11/2016 |
| CN | 107094004 A | 8/2017 |
| CN | 107508571 A | 12/2017 |
| CN | 107528561 A | 12/2017 |
| CN | 108417628 A | 8/2018 |
| CN | 108736856 A | 11/2018 |
| JP | 2000332314 A | 11/2000 |
| JP | 2015216190 A | 12/2015 |

OTHER PUBLICATIONS

"The Reactive Magnetron Sputtering Fabrication and Characterization of the Aluminum Nitride Piezoelectric Thin Films", May 2014, Bi Xiao-Meng, Changchun Institute of Optics, Fine Mechanics and Physics Chinese Academy of Sciences, 108 pgs.

"Influence of the Surface Roughness on the Sorption Sensitivity of Quartz Resonators", Apr. 2004, V.Georgieva, L.Spassov and E.Manolov, IEEE Xplore, 2004 18th European Frequency and time Forum (EFTF 2004), 3 pgs.

"Numerical Study of Impact of Surface Roughness on Thermoelastic Loss of Micro-Resonators", Mar. 2017, Behrouz Shaiari, Tal Nagourney, Ali Darvishian, Jae Yoong Cho and Khalil Najaki, 2017 IEEE International Symposium on Inertial Sensors and Systems (Inertial), 4 pgs.

English Translation of the Written Opinion of the International Search Authority in the international application No. PCT/CN2018/124355, mailed on Sep. 20, 2019, 4 pgs.

International Search Report in the international application No. PCT/CN2018/124355, mailed on Sep. 20, 2019, 2 pgs.

* cited by examiner

METHOD FOR MANUFACTURING RESONATOR

CROSS-REFERENCE TO RELATED APPLICATIONS

The present application is a national stage of International Application No. PCT/CN2018/124355, filed on Dec. 27, 2018, which claims priority to Chinese Patent Application No. 201811577385.2, filed on Dec. 20, 2018. The disclosures of International Application No. PCT/CN2018/124355 and Chinese Patent Application No. 201811577385.2 are hereby incorporated by reference in their entireties.

TECHNICAL FIELD

The disclosure relates to the technical field of semiconductors, and particularly to a method for manufacturing a resonator.

BACKGROUND

A resonator may be used to realize signal processing functions in various electronic applications. For example, in some cellular phones and other communication devices, the resonator is used as a filter for signals transmitted and/or received. Depending on different applications, several different types of resonators may be used, for example, a Film Bulk Acoustic Resonator (FBAR), a coupled resonator filter (SBAR), a Stacked Bulk Acoustic Resonator (SBAR), a Dual Bulk Acoustic Resonator (DBAR) and a Solidly Mounted Resonator (SMR).

A typical acoustic resonator includes an upper electrode, a lower electrode, a piezoelectric material between the upper and lower electrodes, an acoustic reflection structure under the lower electrode and a substrate under the acoustic reflection structure. In general, an overlapping region of three material layers, i.e., the upper electrode, a piezoelectric layer and the lower electrode, in a thickness direction is defined as an effective region of the resonator. When a voltage signal at a certain frequency is applied between the electrodes, an acoustic wave that is vertically propagated may be generated between the upper and lower electrodes in the effective region, due to an inverse piezoelectric effect of the piezoelectric material. The acoustic wave is reflected to and fro between an interface of the upper electrode and the air and the acoustic reflection structure under the lower electrode and resonates at a certain frequency.

According to a conventional method for manufacturing a resonator, it is difficult to control the surface roughness of the working region of the resonator.

SUMMARY

Technical Problem

In view of the foregoing problem, embodiments of the disclosure provide a method for manufacturing a resonator, by which the surface roughness of the working region of the resonator is easier to be controlled.

Technical Solution

In a first aspect, the embodiment of the disclosure provides a method for manufacturing a resonator, which may include the following operations.

A substrate is pretreated to change a preset reaction rate of a preset region of the substrate, so that the preset reaction rate of the preset region is higher than a preset reaction rate of a region outside the preset region.

A preset reaction is performed to the substrate to form a sacrificial material part. The sacrificial material part includes an upper half part above an upper surface of the substrate and a lower half part below a lower surface of the substrate.

A multilayer structure is formed on the sacrificial material part. The multilayer structure successively includes a lower electrode layer, a piezoelectric layer and an upper electrode layer from bottom to top.

The sacrificial material part is removed.

Optionally, the lower half part may be delimited by a bottom surface and a first side surface. The bottom surface is parallel to a surface of the substrate, and the first side surface is a first smooth curved surface extending from an edge of the bottom surface to the upper surface of the substrate.

Optionally, the first smooth curved surface includes a first curved surface and second curved surface that are connected in a manner of smooth transition.

Optionally, the first curved surface has a vertical section with a shape of inverted parabola and is above a plane where the bottom surface is.

The second curved surface has a vertical section with a shape of parabola and is below a plane where the upper surface of the substrate is.

Optionally, a curvature of the first smooth curved surface is less than a first preset value.

Optionally, the upper half part is delimited by a lower surface of the multilayer structure. A part, corresponding to the upper half part, of the multilayer structure includes a top surface and a second side surface. The second side surface is a second smooth curved surface extending from an edge of the top surface to the upper surface of the substrate.

Optionally, the second smooth curved surface includes a third curved surface and fourth curved surface that are connected in a manner of smooth transition.

The third curved surface has a vertical section with a shape of parabola and is below a plane where the top surface is.

The fourth curved surface has a vertical section with a shape of inverted parabola and is above the plane where the upper surface of the substrate is.

Optionally, a curvature of the second smooth curved surface is less than a second preset value.

Optionally, the operation that the preset reaction is performed to the substrate to form the sacrificial material part may include the following operation.

Oxidization treatment is performed to the substrate in an oxidization atmosphere to obtain the sacrificial material part.

In a second aspect, the embodiment of the disclosure provides a method for manufacturing a resonator, which may include the following operations.

A shielding layer is formed on a substrate. The shielding layer covers a region outside a preset region of the substrate.

The substrate on which the shielding layer has been formed is pretreated to control a part, corresponding to the preset region, of the substrate to undergo a preset reaction, so as to obtain a sacrificial material part. The sacrificial material part includes an upper half part above an upper surface of the substrate and a lower half part below a lower surface of the substrate.

The shielding layer of the pretreated substrate is removed.

A multilayer structure is formed on the substrate on which the shielding layer has been removed. The multilayer structure successively includes a lower electrode layer, a piezoelectric layer and an upper electrode layer from bottom to top.

The sacrificial material part is removed.

Optionally, the lower half part is delimited by a bottom surface and a first side surface. The bottom surface is parallel to a surface of the substrate, and the first side surface is a first smooth curved surface extending from an edge of the bottom surface to the upper surface of the substrate.

Optionally, the first smooth curved surface includes a first curved surface and second curved surface that are connected in a manner of smooth transition.

Optionally, the first curved surface has a vertical section with a shape of inverted parabola and is above a plane where the bottom surface is.

The second curved surface has a vertical section with a shape of parabola and is below a plane where the upper surface of the substrate is.

Optionally, a curvature of the first smooth curved surface is less than a first preset value.

Optionally, the upper half part is delimited by a lower surface of the multilayer structure. A part, corresponding to the upper half part, of the multilayer structure includes a top surface and a second side surface, and the second side surface is a second smooth curved surface extending from an edge of the top surface to the upper surface of the substrate.

Optionally, the second smooth curved surface includes a third curved surface and fourth curved surface that are connected in a manner of smooth transition.

Optionally, the third curved surface has a vertical section with a shape of parabola and is below a plane where the top surface is.

The fourth curved surface has a vertical section with a shape of inverted parabola and is above the plane where the upper surface of the substrate is.

Optionally, a curvature of the second smooth curved surface is less than a second preset value.

Optionally, the operation that the shielding layer is formed on the substrate may include the following operation.

A shielding dielectric is provided on the substrate, the shielding layer is used to shield the region outside the preset region of the substrate from the preset reaction.

The shielding dielectric on the preset region is removed to form the shielding layer.

Optionally, the operation that the substrate on which the shielding layer has been formed is pretreated to control the part, corresponding to the preset region, of the substrate to undergo a preset reaction, so as to obtain the sacrificial material part may include the following operation.

Oxidization treatment is performed to the substrate in an oxidization atmosphere to control the part, corresponding to the preset region, of the substrate to undergo a preset reaction, so as to obtain the sacrificial material part.

Optionally, the operation that oxidization treatment is performed to the substrate in the oxidization atmosphere may include the following operation.

High-purity oxygen is introduced toward the substrate in an environment at a process temperature of a preset range to form an oxide layer on the part, corresponding to the preset region, of the substrate.

After a first preset time period, the introduction of the high-purity oxygen toward the substrate is stopped, and wet-oxygen oxidization or hydrogen-oxygen synthetic oxidization is performed to form the oxide layer with the preset thickness on the substrate.

The introduction of the introduction of wet oxygen toward the substrate is stopped, and the high-purity oxygen is introduced toward the substrate for a second preset time period to complete oxidization treatment to the substrate.

Optionally, the preset range may be 1,000° C. to 1,200° C., the first preset time period may be 20 minutes to 40 minutes, the preset thickness may be 1p m, the second preset time period may be 20 minutes to 40 minutes, and a flow of the high-purity oxygen may be 3 L/minute to 5 L/minute.

Optionally, a dielectric layer may be made by SiN or AlN, and the substrate may be a silicon substrate.

Beneficial Effects

According to the embodiments of the disclosure, the resonator with a special cavity structure is formed by the following operations: pretreating the substrate to make the reaction rate of the preset region of the substrate higher than the preset reaction rate of the region outside the preset region, so as to form the sacrificial material part with a preset shape when the preset reaction is performed on the substrate, then forming the multilayer structure on the sacrificial material part, and finally removing the sacrificial material part. Compared with a conventional method for manufacturing a resonator, the method of the disclosure has the advantage that surface roughness of the working region of the resonator is easier to be controlled.

BRIEF DESCRIPTION OF THE DRAWINGS

In order to illustrate the technical solutions in the embodiments of the disclosure more clearly, the disclosure will be further elaborated with the drawings for illustrating the embodiments or the prior art. It is apparent that the drawings illustrated below only show some embodiments of the disclosure. Other drawings may further be obtained by those of ordinary skill in the art according to these drawings without creative work.

DETAILED DESCRIPTION

For making the technical problem to be solved, technical solutions and beneficial effects of the disclosure clearer, the disclosure will be further described below with reference to the drawings and the embodiments in detail. It is to be understood that specific embodiments described here are merely used to illustrate the disclosure, but are not intended to limit the disclosure.

The disclosure will further be described below with reference to the drawings and specific implementation modes in detail.

Figure 1:
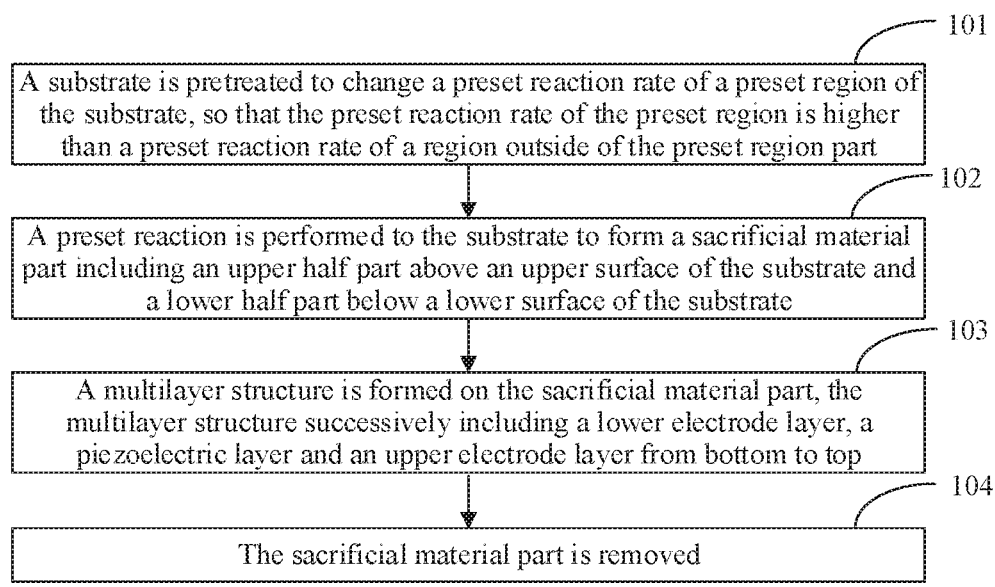
FIG. 1 is a flowchart of a method for manufacturing a resonator according to an embodiment of the disclosure.

Referring to FIG. 1, a method for manufacturing a resonator according to an embodiment of the disclosure is provided. The method includes the following steps.

At step 101, a substrate is pretreated to change a preset reaction rate of a preset region of the substrate, so that the preset reaction rate of the preset region is higher than a preset reaction rate of a region outside the preset region.

In this step, the preset region of the substrate is pretreated to achieve the effect for the preset reaction rate of the preset region of the substrate that the preset reaction rate of the preset region is higher than the preset reaction rate of the region outside the preset region. Therefore, when the preset reaction is performed to the substrate in subsequent step 302, it can be ensured that the reaction rate of the preset region is different from that of the region outside the preset region, thereby forming a sacrificial material part having a preset shape.

At step 102, the preset reaction is performed to the substrate to form the sacrificial material part. The sacrificial material part includes an upper half part above an upper surface of the substrate and a lower half part below a lower surface of the substrate.

The lower half part is delimited by a bottom surface and a first side surface, the whole bottom surface is parallel to the surface of the substrate, and the first side surface is a first smooth curved surface extending from an edge of the bottom surface to the upper surface of the substrate. The upper half part is delimited by a lower surface of the multilayer structure. A part, corresponding to the upper half part, of the multilayer structure includes a top surface and a second side surface, and the second side surface is a second smooth curved surface extending from an edge of the top surface to the upper surface of the substrate.

Optionally, the first smooth curved surface includes a first curved surface and second curved surface that are connected in a manner of smooth transition. The first curved surface has a vertical section with a shape of inverted parabola and is above a plane where the bottom surface is, and the second curved surface has a vertical section with a shape of parabola and is below a plane where the upper surface of the substrate is.

Optionally, the second smooth curved surface includes a third curved surface and fourth curved surface that are connected in a manner of smooth transition. The third curved surface has a vertical section with a shape of parabola and is below a plane where the top surface is, and the fourth curved surface has a vertical section with a shape of inverted parabola and is above the plane where the upper surface of the substrate is.

In an embodiment, a curvature of the first smooth curved surface is less than a first preset value, and a curvature of the second smooth curved surface is less than a second preset value.

It can be understood that, since the preset reaction rate of the preset region is higher than the preset reaction rate of the region outside the preset region, a sacrificial material part with a preset shape can be formed due to the faster reaction rate of the preset region part and the slower reaction rate of the region outside the preset region when performing the preset reaction to the substrate.

In an embodiment, step 102 is specifically done as follows. Oxidization treatment is performed on the substrate in an oxidization atmosphere to obtain the sacrificial material part. Correspondingly, the pretreatment performed on the substrate during step 101 is a manner to increase the oxidization reaction rate of the preset region of the substrate. The manner may be performing ion implantation to the preset region to increase the oxidization reaction rate of the preset region of the substrate, and may also be forming a shielding layer with a preset pattern on the substrate to increase the oxidization treatment rate of the preset region of the substrate.

Certainly, in another embodiment, the pretreatment of step 101 may also be performed by other manners, in addition to the oxidization treatment. Similarly, the manner may be performing ion implantation to the preset region to increase the oxidization reaction rate of the preset region of the substrate, and may also be forming the shielding layer with the preset pattern on the substrate to increase the oxidization treatment rate of the preset region of the substrate.

At step 103, a multilayer structure is formed on the sacrificial material part. The multilayer structure successively includes a lower electrode layer, a piezoelectric layer and an upper electrode layer from bottom to top.

At step 104, the sacrificial material part is removed to form the resonator.

In the embodiment, the substrate may be, but not limited to silicon substrate or a substrate made from another material.

According to the method for manufacturing the resonator, the resonator with a special cavity structure is formed as follows: pretreating the substrate to make the reaction rate of the preset region of the substrate higher than the preset reaction rate of the region outside the preset region part, so as to form the sacrificial material part with the preset shape when performing the preset reaction to the substrate, then forming the multilayer structure on the sacrificial material part and finally removing the sacrificial material part. Compared with a conventional method for manufacturing a resonator, the method has the advantage that surface roughness of the working region of the resonator is easier to be controlled.

Figure 2:
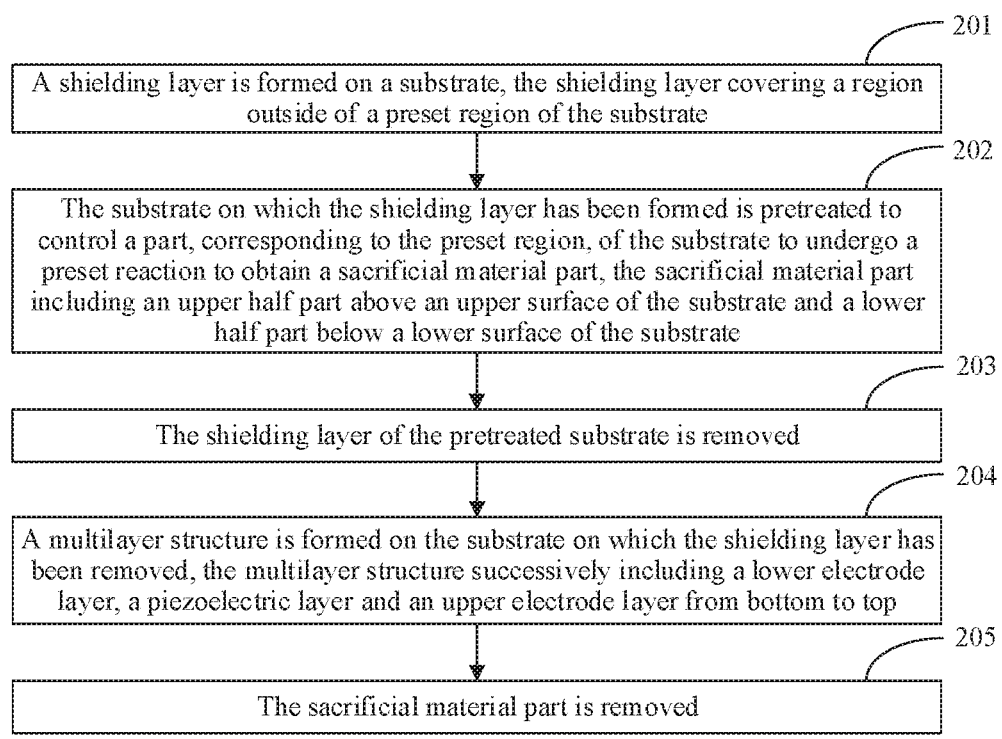
FIG. 2 is a flowchart of a method for manufacturing a resonator according to another embodiment of the disclosure.

Referring to FIG. 2, a method for manufacturing a resonator according to another embodiment of the disclosure is provided. This method includes the following steps.

Figure 3A:
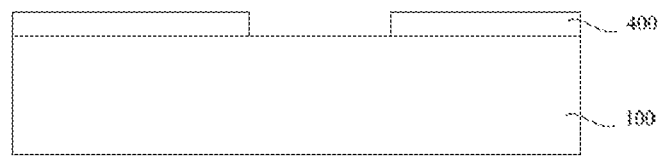
FIGS. 3A-3E are schematic diagrams of a process for manufacturing a resonator according to an embodiment of the disclosure.

At step 201, a shielding layer 400 is formed on a substrate. The shielding layer 400 covers a region outside a preset region of the substrate 100, as shown in FIG. 3A.

In this step, the formation of the shielding layer 400 may include the following operations.

A shielding dielectric is provided on the substrate. The shielding layer is used to shield the region outside the preset region of the substrate from a preset reaction.

The shielding dielectric on the preset region is removed to form the shielding layer.

The shielding dielectric is used to make the reaction rate of a region, covered with the shielding dielectric, of the substrate lower than the reaction rate of a region uncovered with the shielding dielectric. Furthermore, the shielding layer may be used to shield the region outside the preset region, of the substrate from the preset reaction.

At step 202, the substrate 100 on which the shielding layer 400 has been formed is pretreated to control a part, corresponding to the preset region, of the substrate to undergo the preset reaction to obtain a sacrificial material part 500. The sacrificial material part 500 includes an upper half part above an upper surface of the substrate 100 and a lower half part below a lower surface of the substrate 100.

The lower half part is delimited by a bottom surface and a first side surface. The whole bottom surface is parallel to the surface of the substrate, and the first side surface is a first smooth curved surface extending from an edge of the bottom surface to the upper surface of the substrate. The upper half part is delimited by a lower surface of the multilayer structure. The part, corresponding to the upper half part, of the multilayer structure includes a top surface and a second side surface. The second side surface is a second smooth curved surface extending from an edge of the top surface to the upper surface of the substrate.

Optionally, the first smooth curved surface includes a first curved surface and second curved surface that are connected in a manner of smooth transition. For example, the first curved surface has a vertical section with a shape of inverted parabola and is above a plane where the bottom surface is, and the second curved surface has a vertical section with a shape of parabola and is below a plane where the upper surface of the substrate is.

Optionally, the second smooth curved surface includes a third curved surface and fourth curved surface that are connected in a manner of smooth transition. The third curved surface has a vertical section with a shape of parabola and is below a plane where the top surface is, and the fourth curved surface has a vertical section with a shape of inverted parabola and is above the plane where the upper surface of the substrate is.

In an embodiment, a curvature of the first smooth curved surface is less than a first preset value, and a curvature of the second smooth curved surface is less than a second preset value.

Figure 3B:
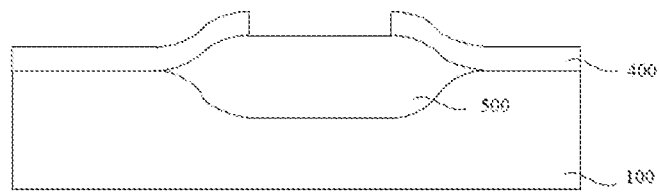

As an implementable mode, step 202 can be done as follows: oxidization treatment is performed to the substrate in an oxidization atmosphere to control the part, corresponding to the preset region, of the substrate to undergo the oxidization reaction, so as to obtain the sacrificial material part 500, as shown in FIG. 3B.

The oxidization treatment of the substrate in the oxidization atmosphere may include the following operation.

High-purity oxygen is introduced toward the substrate in an environment at a process temperature of a preset temperature range to form an oxide layer on the part, corresponding to the preset region, of the substrate 100.

After a first preset time period, the introduction of high-purity oxygen toward the substrate is stopped. Through one or more manners selected from wet-oxygen oxidization, hydrogen-oxygen synthetic oxidization and high-pressure vapor oxidization, the oxide layer with a preset thickness is formed on the substrate.

Wet oxygen is stopped to be introduced toward the substrate, and the high-purity oxygen is introduced toward the substrate for a second preset time period to complete oxidization treatment to the substrate.

The preset temperature range may be 1,000° C. to 1,200° C., the first preset time period may be 20 minutes to 140 minutes, the preset thickness may be 0.4 µm to 4 µm, the second preset time period may be 20 minutes to 140 minutes, and a flow of the high-purity oxygen may be 3 L/minute to 15 L/minute.

It should be noted that there might be certain differences in the morphology of the transition region when one or more manners selected from pure oxygen, wet oxygen, hydrogen-oxygen synthesis and high-pressure vapor oxidization are used. In addition, the type and structure of the shielding layer have a certain influence on the morphology of the transition region. The manner for oxidization as well as the type and structure of the shielding layer are reasonably selected according to the thickness of the multilayer structure and the requirement of the piezoelectric layer on a curvature change.

Figure 3C:
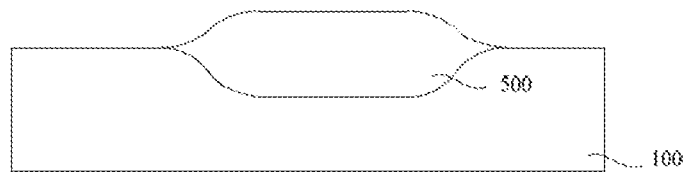

At step 203, the shielding layer 400 of the pretreated substrate is removed, referring to FIG. 3C.

Figure 3D:
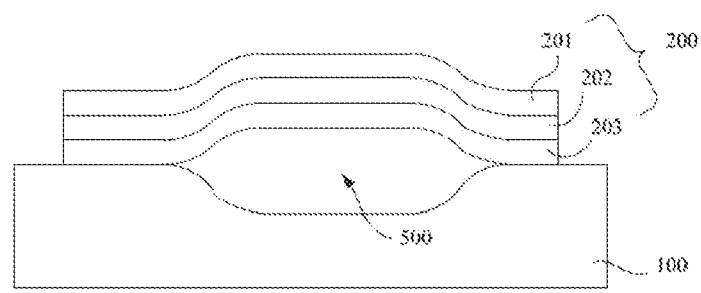

At step 204, a multilayer structure is formed on the substrate 100 on which the shielding layer 400 has been removed. The multilayer structure successively includes a lower electrode layer 203, a piezoelectric layer 202 and an upper electrode layer 201 from bottom to top, referring to FIG. 3D.

Figure 3E:
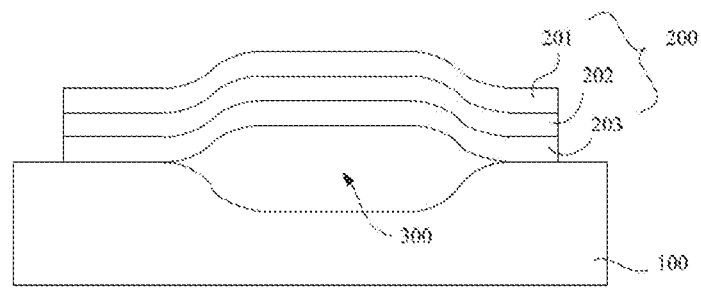

At step 205, the sacrificial material part 500 is removed, referring to FIG. 3E.

In the embodiment, the shielding layer may be made from SiN, $SiO_2$, polysilicon, or have a multilayer structure composed of a combination of layers made from two or three materials mentioned above. The substrate 100 may be a silicon substrate or a substrate made from other materials. There are no limits in this regard.

In an embodiment, the shielding layer may be made from SiN, and may also have a multilayer film structure. When SiN is used to form the oxide shielding layer, a relatively good shielding effect would be achieved, resulting in a significant difference of reaction rates between a shielding region and a non-shielding region. The shielding dielectric on a region where a resonator is required to be manufactured may be removed by means of etching or corrosion, etc. When a silicon wafer is oxidized in the oxidization atmosphere, the reaction rate of the region covered with the shielding dielectric is greatly different from the reaction rate of the region not covered with the shielding dielectric. The reaction rate of the region not covered with the shielding dielectric is higher. Si of the substrate reacts with oxygen to generate $SiO_2$, and the generated $SiO_2$ continuously increases in the thickness. Therefore, an upper surface of the region on which the reaction occurs, of the substrate gradually gets higher than the surface of the region covered with the shielding dielectric. The Si surface of the region not covered with the shielding dielectric gradually gets lower, and relative to the surface, which gets lower, of the part not including the shielding dielectric. Since oxygen will enter from the side at the edge of the shielding layer and will enter below the shielding layer, an oxidization rate at the edge of the shielding layer is lower than an oxidization rate of the region not covered with the shielding dielectric and higher than an oxidization rate of the region covered with shielding dielectric. The closer to the edge of the shielding dielectric, the closer the rate to the oxidization rate of the region not covered with the shielding dielectric. A transition region where no changes occur in the rate may be formed at the edge of the shielding layer. At the transition region, a smooth curved surface may be formed by optimizing an oxidization manner and a type and structure of the shielding layer, such that a crystal quality of the piezoelectric film may be ensured when growing a multilayer structure comprising a piezoelectric film, such as AlN, on this smooth curved surface.

According to the method for manufacturing the resonator, a resonator with a special cavity structure is formed by forming the shielding layer on the substrate at first, then pretreating the substrate on which the shielding layer has been formed to control the part, corresponding to the preset region, of the substrate, to undergo the preset reaction to obtain the sacrificial material part, next removing the shielding layer of the pretreated substrate, then forming the multilayer structure on the substrate of which the shielding layer has been removed, and finally removing the sacrificial material part. Compared with a conventional method for manufacturing a resonator, the method has the advantage that surface roughness of a working region of the resonator is easier to be controlled.

Figure 4:
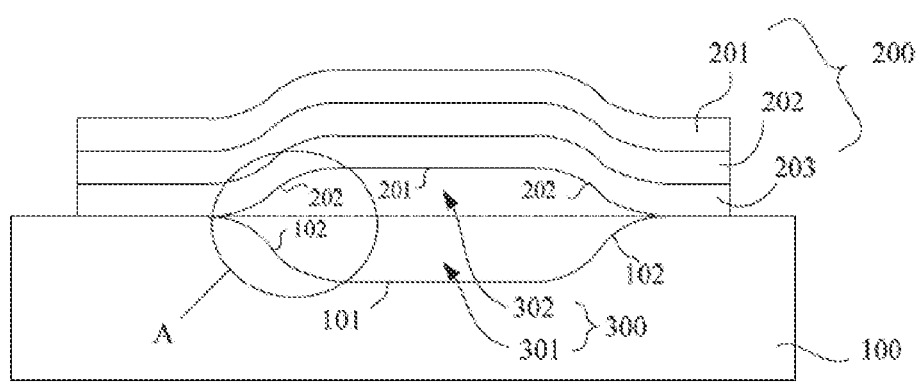
FIG. 4 is a schematic structural diagram of a resonator according to an embodiment of the disclosure.

Referring to FIG. 4, a resonator of an embodiment of the disclosure is provided. The resonator includes a substrate 100 and a multilayer structure 200. The multilayer structure 200 is formed on the substrate 100, and the multilayer structure 200 successively includes a lower electrode layer 203, a piezoelectric layer 202 and an upper electrode layer 201 from bottom to top. A cavity 300 is formed between the substrate 100 and the multilayer structure 200, and the cavity 300 includes a lower half cavity 310 below an upper surface of the substrate 100 and an upper half cavity 320 beyond the upper surface of the substrate 100 and protruding towards the multilayer structure 200.

Referring to FIG. 4, in an embodiment, the lower half cavity 310 is delimited by a bottom wall 101 and a first sidewall 102. The whole bottom wall 101 is parallel to the surface of the substrate 100, and the first sidewall 102 is a first smooth curved surface extending from an edge of the bottom wall 101 to the upper surface of the substrate 100.

Both the bottom wall 101 and the first sidewall 102 are surface walls of the substrate 100. The first sidewall 102 is the first smooth curved surface, so that performances of the resonator cavity can be ensured, and no sudden changes would occur.

Figure 5:
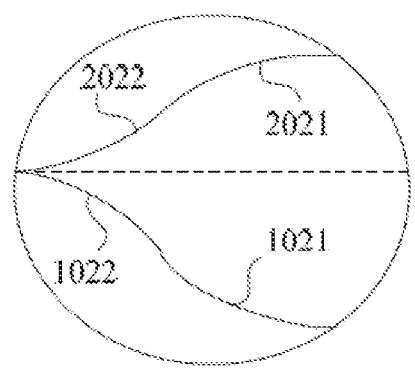
FIG. 5 is an enlarged schematic diagram of part A in FIG. 4.

Referring to FIG. 5, in an embodiment, the first smooth curved surface may include a first curved surface 1021 and second curved surface 1022 that are connected in a manner of smooth transition. The first curved surface 1021 and second curved surface 1022 that are connected in a manner of smooth transition means that there is no sudden change at the junction between the first curved surface 1021 and the second curved surface 1022, and both the first curved surface 1021 and the second curved surface 1022 are curved surfaces with no sudden changes, so that the performances of the resonator cavity may be ensured. The substrate 100 is formed by a plurality of crystals (for example, silicon crystals), and no sudden changes mean that gaps between crystals at the first smooth curved surface should not be too large and influence the performances of the resonator.

For example, a vertical section of the first curved surface 1021 may have a shape of inverted parabola and is above a plane where the bottom wall 101 is, and a vertical section of the second curved surface 1022 may have a shape of parabola and is below a plane where the upper surface of the substrate 100 is, The first curved surface 1021 is connected with the second curved surface 1022 in a manner of smooth connection. Certainly, the first curved surface 1021 and the second curved surface 1022 may also be curved surfaces in other shapes, as long as the gaps between crystals at the first smooth curved surface do not influence the performances of the resonator.

In an embodiment, when it is mentioned that the whole first smooth curved surface is smooth, it may mean that a curvature of the first smooth curved surface 1021 at each point is less than a first preset value. The first preset value may be determined according to a practical condition such that the gaps between crystals at the first smooth curved surface do not influence the performances of the resonator. For ensuring a mechanical characteristics and electrical characteristics of the multilayer structure, a curvature of the smooth curved surface at the transition region is required to be as low as possible. Given a certain thickness of a sacrificial layer, the curvature as low as possible may cause a length of the transition region to increase, resulting in an increase of an area of a single resonator. Therefore, the curvature and the length of the transition region need to be optimized. Preferably, a thickness of the cavity 300 may be 1 μm, and the length of the transition region is controlled between 3 μm and 5 μm. The multilayer structure formed on this transition region can meet a requirement for the resonator. The length of the transition region is a length of the first sidewall 102 in a direction illustrated by the dotted line in FIG. 4.

Referring to FIG. 5, in an embodiment, the upper half cavity 302 may be delimited by a lower surface of the multilayer structure 200. The part, corresponding to the upper half cavity 302, of the lower surface of the multilayer structure 200 includes a top wall 201 and a second sidewall 202. The second sidewall 202 is a second smooth curved surface extending from an edge of the top wall 201 to the upper surface of the substrate 100.

Both the top wall 201 and the second sidewall 202 are lower walls of the multilayer structure 200. The second sidewall 202 is the second smooth curved surface, so that the performances of the resonator cavity can be ensured, and no sudden changes would occur.

Referring to FIG. 5, in an embodiment, the second smooth curved surface may include a third curved surface 2021 and fourth curved surface 2022 that are connected in a manner of smooth transition. The third curved surface 2021 and fourth curved surface 2022 that are connected in a manner of smooth transition means there is no sudden change at the junction between the third curved surface 2021 and the fourth curved surface 2022, and both the third curved surface 2021 and the fourth curved surface 2022 are also curved surfaces with no sudden changes, so that the performances of the resonator cavity may be ensured. From the aspect of crystal, the substrate 100 is formed by a plurality of crystals (for example, silicon crystals), and no sudden change means that gaps between crystals at the second smooth curved surface should not be too large and influence the performances of the resonator.

For example, a vertical section of the third curved surface 2021 may have a shape of parabola and is below a plane where the top wall 201 is. A vertical section of the fourth curved surface 2022 may have a shape of inverted parabola and is above the plane where the upper surface of the substrate 100 is. Certainly, the third curved surface 2021 and the fourth curved surface 2022 may also be in other shapes, as long as the gaps between crystals at the first smooth curved surface do not influence the performances of the resonator.

In an embodiment, a curvature of the second smooth curved surface 2021 at each point is less than a second preset value. The second preset value may be determined according to the practical condition such that the gaps between crystals at the second smooth curved surface do not influence the performances of the resonator.

Furthermore, the top wall 201 does not include sudden change. The sudden change mentioned here has the same meaning as the above mentioned sudden change. From the aspect of crystal, the multilayer structure 200 is formed by a plurality of crystals, and no sudden change means that gaps between crystals at the top wall 201 should not be too large and influence the performances of the resonator.

In the above embodiments, the substrate 100 may be a silicon substrate or a substrate made from other materials. There are no limits in this regard.

Figure 6:
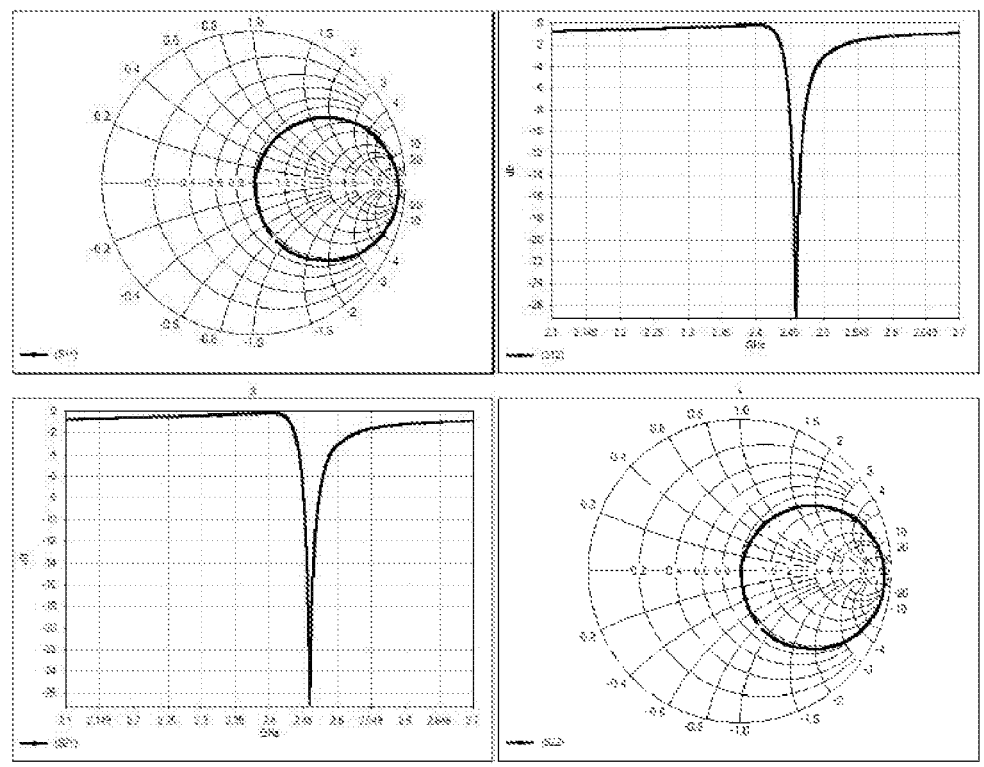
FIG. 6 is a performance test diagram of a resonator according to an embodiment of the disclosure.

Referring to FIG. 6, it shows data from the performance test of the resonator manufactured in the embodiment of the disclosure. For the resonator with such a structure, series resonance and parallel resonance frequencies are 2.393 GHz and 2.457 GHz respectively, Q-value in series resonance is 1,513, Q-value in parallel resonance is 1,079, and an electromechanical coupling coefficient is 5.2%.

The resonator manufactured through the method for manufacturing a resonator mentioned above, is provided with the cavity 300 having the lower half cavity 310 and the upper half cavity 320. The whole lower half cavity 310 is below the upper surface of the substrate 100, and the whole upper half cavity 320 is above the upper surface of the substrate 100. Compared with a conventional method for manufacturing a resonator, the method has the advantage that surface roughness of a working region of the resonator is easier to be controlled.

The above is only the preferred embodiment of the disclosure and not intended to limit the disclosure. Any modifications, equivalent replacements, improvements and the like made within the spirit and principle of the disclosure shall fall within the scope of protection of the disclosure.

The invention claimed is:

1. A method for manufacturing a resonator, comprising:
    forming a shielding layer on an upper surface of a substrate, the shielding layer covering a region outside a preset region of the substrate;
    pretreating the upper surface of the substrate on which the shielding layer has been formed to control a part, corresponding to the preset region, of the substrate to undergo a preset reaction, so as to obtain a sacrificial material part, the sacrificial material part comprising an upper half part above the upper surface of the substrate and a lower half part below the upper surface of the substrate;
    removing the shielding layer after the pretreating the upper surface of the substrate;
    forming a multilayer structure on the substrate on which the shielding layer has been removed, wherein the multilayer structure successively comprises a lower electrode layer, a piezoelectric layer and an upper electrode layer from bottom to top, and the lower electrode layer is in contact with the sacrificial material part and covers an upper surface of the sacrificial material part; and
    removing the sacrificial material part,
    wherein the pretreating the upper surface of the substrate on which the shielding layer has been formed to control the part, corresponding to the preset region, of the substrate to undergo the preset reaction to obtain the sacrificial material part comprises:
        performing oxidization treatment to the upper surface of the substrate on which the shielding layer has been formed in an oxidization atmosphere to control the part, corresponding to the preset region, of the substrate to undergo an oxidization reaction to obtain the sacrificial material part.

2. The method for manufacturing a resonator of claim 1, wherein the lower half part is formed as being delimited by a bottom surface and a first side surface, an entirety of the bottom surface is parallel to a surface of the substrate, and the first side surface is a first smooth curved surface extending from an edge of the bottom surface to the upper surface of the substrate.

3. The method for manufacturing a resonator of claim 2, wherein the first smooth curved surface is formed as comprising a first curved surface and second curved surface that are connected in a manner of smooth transition.

4. The method for manufacturing a resonator of claim 3, wherein the first curved surface is formed as having a vertical section with a shape of an inverted parabola and being above a plane where the bottom surface is disposed; and the second curved surface is formed as having a vertical section with a shape of a parabola and being below a plane where the upper surface of the substrate is disposed.

5. The method for manufacturing a resonator of claim 2, wherein a curvature of the first smooth curved surface is formed as being less than a first preset value.

6. The method for manufacturing a resonator of claim 1, wherein the upper half part is formed as being delimited by a lower surface of the multilayer structure,
    a part, corresponding to the upper half part, of the multilayer structure comprises a top surface and a second side surface, and the second side surface is a second smooth curved surface extending from an edge of the top surface to the upper surface of the substrate.

7. The method for manufacturing a resonator of claim 6, wherein the second smooth curved surface is formed as comprising a third curved surface and fourth curved surface that are connected in a manner of smooth transition.

8. The method for manufacturing a resonator of claim 7, wherein the third curved surface is formed as having a vertical section with a shape of a parabola and being below a plane where the top surface is disposed; and
    the fourth curved surface is formed as having a vertical section with a shape of an inverted parabola and being above a plane where the upper surface of the substrate is disposed.

9. The method for manufacturing a resonator of claim 6, wherein a curvature of the second smooth curved surface is formed as being less than a second preset value.

10. The method for manufacturing a resonator of claim 1, wherein the performing oxidization treatment to the upper surface of the substrate on which the shielding layer has been formed in the oxidization atmosphere comprises:
    introducing high-purity oxygen toward the upper surface of the substrate on which the shielding layer has been formed in an environment at a process temperature of a preset temperature range to form an oxide layer on the part, corresponding to the preset region, of the substrate on which the shielding layer has been formed;
    after a first preset time period, stopping the introduction of the high-purity oxygen toward the upper surface of the substrate on which the shielding layer has been formed, and forming the oxide layer with a preset thickness on the substrate by wet-oxygen oxidization or hydrogen-oxygen synthetic oxidization; and
    stopping the introduction of wet oxygen toward the upper surface of the substrate on which the shielding layer has been formed, and introducing the high-purity oxygen toward the upper surface of the substrate on which the shielding layer has been formed for a second preset time period to complete the oxidization treatment to the upper surface of the substrate on which the shielding layer has been formed.

11. The method for manufacturing a resonator of claim 10, wherein the preset temperature range is 1,000° C. to 1,200° C., the first preset time period is 20 minutes to 40 minutes, the preset thickness is 1 μm, the second preset time period is 20 minutes to 40 minutes, and a flow of the high-purity oxygen is 3 L/minute to 5 L/minute.

12. The method for manufacturing a resonator of claim 1, wherein the shielding layer is formed by using SiN or AlN, and the substrate is formed by using silicon.

* * * * *